July 30, 1957 J. I. PANKOVE 2,801,348

SEMICONDUCTOR DEVICES

Filed May 3, 1954

INVENTOR.
JACQUES I. PANKOVE
BY J. C. Whittaker
ATTORNEY 2,801,348

SEMICONDUCTOR DEVICES

Jacques I. Pankove, Princeton, N. J., assignor to Radio Corporation of America, a corporation of Delaware Application May 3, 1954, Serial No. 427,228

14 Claims. (Cl. 307—88.5)

This invention relates to semiconductor devices and particularly to semiconductor devices suitable for high frequency operation.

One general type of semiconductor device to which the principles of the invention apply is known as a transistor, one conventional type of which comprises a body of semiconductor material having two rectifying electrodes in contact therewith. The rectifying electrodes may be surface barrier electrodes of the small area variety such as point or line contacts. The rectifying electrodes may also be surface barrier electrodes of comparatively large area for example, plates or films in rectifying contact with the surface of the crystal or they may be P-N junction electrodes. In this type of transistor one rectifying electrode is operated as an input or emitter electrode and injects minority charge carriers into the crystal. The minority charge carriers are collected by the other rectifying electrode which is termed the output or collector electrode. A base electrode is in ohmic contact with the crystal and, by determining the electrical potential of the crystal, serves to control the emitter-to-collector current flow.

In typical transistor operation, the charge carriers which flow through the semiconductor body from the emitter to the collector proceed by a process of diffusion. By this process, the movement of the carriers is determined among other things by their innate mobilities and by their concentration gradient.

As a consequence of the diffusion process, charge carriers injected by the emitter spread out from the emitter in all directions whereby some are lost due to recombination. In addition, those charge carriers which do proceed to the collector follow transit paths of different lengths as a result of which they have different transit times. Thus the high frequency operation of a transistor employing the diffusion process is limited.

Another characteristic of transistors of the above-described type having emitter, collector and base electrodes is that, when the device is used as an amplifier or the like, an input signal may be applied either to the emitter electrode or to the base electrode. However, such a device is not suitable for operation with more than one signal input and, thus, it is not suitable for performing complex operations such as signal mixing.

Accordingly, an important object of this invention is to provide a semi-conductor device of new and improved form.

A further object of the invention is to provide an improved semiconductor device having improved high frequency operation and suitable for performing comparatively complex operations.

Another object of the invention is to provide an improved semi-conductor device suitable for providing signal mixing operation.

In general, the principles and objects of this invention are accomplished by a semiconductor device having a semiconductor crystal or body and, in rectifying contact therewith, an input or emitter electrode and one or more output or collector electrodes for receiving current from said emitter electrode. A pair of ohmic contact (non-rectifying) electrodes are bonded to the body and a voltage source is connected between said ohmic electrodes for applying to the semiconductor body an electric field oriented to promote the flow of current between the input and output electrodes.

According to the invention, further rectifying electrode means in contact with the semiconductor body provides a controlling action on the magnitude of this electric field. The rectifying electrode means, preferably, comprises a P-N junction electrode which includes regions of P-type and N-type material separated by a rectifying barrier. The P-N junction electrode is biased in the reverse direction so that a space charge region forms in the body at the barrier. This functions, in effect, as a thickening of the rectifying barrier or as a penetration of the barrier into the semiconductor body with a resultant effective reduction in the cross-sectional area of the body. This space charge region and the resultant effective penetration of the barrier is modulated by a signal applied to the electrode whereby the cross-sectional area and resistance of the body are varied and the intensity of the effective electric field therein is varied.

The device, as thus operated, in effect, provides a novel combination of an electric field for controlling current flow in a semiconductor device and a rectifying element for controlling the electric field whereby an auxiliary operation such as signal mixing may be achieved by the application of separate signals to a plurality of electrodes, for example to the input electrode of the device and to the rectifying control electrode.

According to the various aspects of the invention the input and output electrodes may be positioned on the same or opposite surfaces of a semiconductor crystal while the rectifying control electrode may be positioned on one or the other of said surfaces. In addition, the input and output electrodes may be in the form of rings with the rectifying control electrode positioned within one of the rings. The electric field applied to the semiconductor crystal may be either an unidirectional field or it may be a directionally-varying field.

The invention is described in greater detail by reference to the drawing wherein.

Similar elements are designated by simlar reference characters throughout the drawing.

Figures 1, 2, 3, 4, 5, 6:
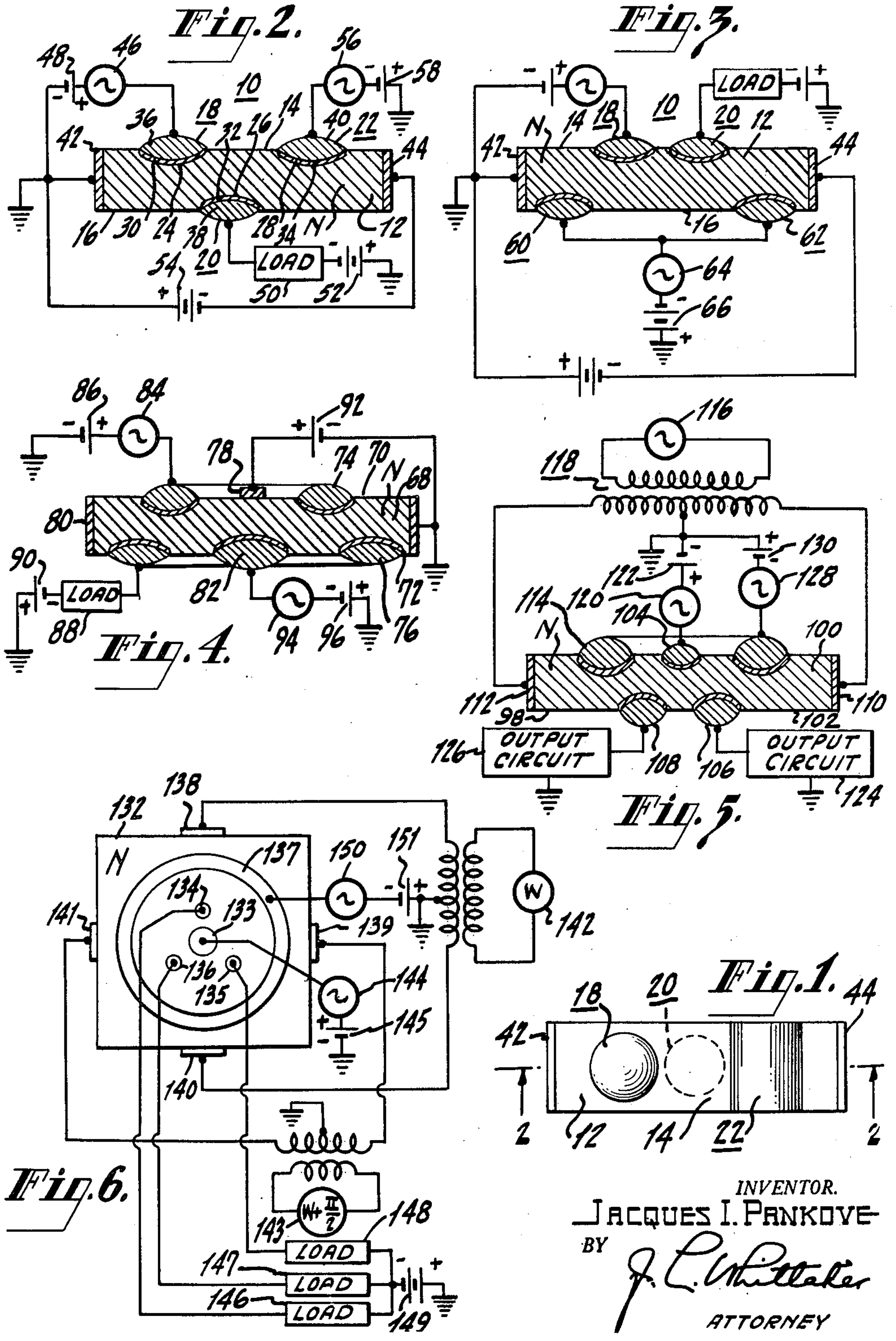
Fig. 1 is a plan view of a first embodiment of the invention.
Fig. 2 is a sectional elevational view along the line 2—2 of Fig. 1 and a schematic representation of a circuit in which the first embodiment of the invention may be operated.
Fig. 3 is a sectional elevational view of a second embodiment of the invention and a schematic representation of a circuit in which it may be operated.
Fig. 4 is a sectional elevational view of a third embodiment of the invention and a schematic representation of a circuit in which it may be operated.
Fig. 5 is a sectional elevational view of a fourth embodiment of the invention and a schematic representation of a circuit in which it may be operated; and, Fig. 6 is a plan view of a fifth embodiment of the invention and a schematic representation of a circuit in which it may be operated.

Referring to Figures 1 and 2, a semiconductor device 10, according to a first embodiment of the invention comprises a body or crystal 12 of germanium, silicon or the like of N-type or P-type conductivity. In the following description, the crystal will be assumed to be N-type germanium. The crystal 12 has two substantially plane, parallel surfaces 14 and 16 and is provided with an emitter rectifying electrode 18 in contact with the surface 14 and a collector rectifying electrode 20 in contact with the surface 16 and offset from the emitter electrode. The emiter and collector rectifying electrodes may be surface barrier electrodes of small area point or line contact type or they may be comparatively large-area surface barrier plates or films or the like. The electrodes 18 and 20 may also be and are, preferably, P-N junction-type electrodes. The adjacent edges of the electrodes 18 and 20 are preferably vertically aligned as shown to promote charge collection.

According to the invention, the crystal 12 is provided with another rectifying control electrode 22, also preferably a P-N junction electrode, which is intended for operation as a control electrode and is in contact preferably with the entire width of the surface 14 at a region remote from the emitter electrode 18. The P-N junction electrodes 18, 20, 22 are substantially longitudinally aligned on the crystal 12 as shown and are preferably formed by an alloying or fusion process such as that described in a copending U. S. patent application of Charles W. Mueller, Serial No. 295,304, filed June 24, 1952, and assigned to the assignee of this application. According to Mueller's method, pellets or disks of a suitable impurity material are alloyed into the appropriate surfaces of the crystal 12 to form the desired P-N junction electrodes. This alloying method produces in the electrodes 18, 20, 22 rectifying barriers 24, 26, 28, respectively, and, adjacent to the barriers, thin layers of material 30, 32, 34, respectively, of a conductivity-type opposite to that of the crystal, in this case P-type. Finally, adjacent to the P-type layers, are regions 36, 38, 40 respectively, of material which comprises an alloy of the body material and the impurity material and is, essentially metallic in character.

In the preparation of the P-N junction electrodes, if the body or crystal 12 comprises N-type semiconductor material, then any one of indium, gallium, aluminum, zinc or boron, for example, may be used as the impurity material to produce the P-N junction electrodes. If the semiconductor body is of P-type material, then any one of phosphorus, arsenic, antimony or bismuth, for example, may be used.

Two base electrodes 42 and 44 are bonded to the body 12 at opposite ends thereof and in ohmic (non-rectifying) contact therewith. The base electrodes are preferably longitudinally aligned with the P-N junction electrodes 18, 20 and 22. The base electrodes may be in the form of disks, tabs, or plates of tin or nickel, or the like soldered to the semiconductor body.

In the circuit shown in Figure 2, the emitter electrode 18 is connected through a signal source 46 to the positive terminal of a battery 48, the negative terminal of which is connected to one of the base electrodes, e. g. 42, and to a point of reference potential, such as ground. The emitter electrode is thus biased in the forward direction with respect to the semiconductor crystal 12 and is adapted to inject minority charge carriers into the crystal. The collector electrode 20 is connected through a suitable load device 50 to the negative terminal of a battery 52, the positive terminal of which is grounded. The collector electrode is thus biased in the reverse direction with respect to the crystal and is adapted to collect charge carriers injected by the emitter electrode. A source of voltage, for example a battery 54, is connected between the electrodes 42 and 44 and is oriented as shown to provide a longitudinal electric field in the crystal 12 to promote the flow of minority charge carriers, in this case holes, from the emitter to the collector.

The control electrode 22 is connected to a signal source 56 and to the negative terminal of a battery 58, the positive terminal of which is connected to ground. The control electrode is thus biased in the reverse direction with respect to the crystal and the space charge region associated with the rectifying barrier 28, in effect, penetrates into the crystal 12 in the direction of the surface 16. The degree of penetration of the space charge region depends on the magnitude of the reverse voltage applied to the electrode 22.

As the space charge region of the barrier 26 penetrates into the crystal it, in effect, reduces the cross-sectional area of the crystal and thus increases the resistance of the crystal under electrode 22. Thus, the distribution of the voltage drop along the crystal 12 due to the battery 54 becomes non-uniform with a larger portion of the drop appearing across the high resistance region under the electrode 22. At the same time, a smaller portion of the voltage drop appears across the portion of the crystal including the emitter and collector electrodes and the electric field aiding charge carrier flow between these electrodes is reduced. A signal from the source 56 varies the bias on the control electrode 22 and thus varies the degree of penetration of the space charge region into the crystal and, similarly, varies the effective cross-sectional area of the crystal under the electrode 22. Thus, the distribution of the voltage drop across the crystal and the effective electric field are varied to provide the desired control action.

Thus, the device and circuit of Figures 1 and 2 provide an electric field for promoting the emitter-to-collector current flow in the crystal 12 and means for modulating the electric field and the current flow. In addition, in accommodating two signal sources 46 and 56, the device provides a form of mixer action, with one signal source 46 operating into a comparatively low input impedance and the other signal source 56 operating into a comparatively high input impedance.

In a second embodiment of the invention, shown in Figure 3, the device 10 has the emitter and collector P-N junction electrodes 18 and 20, respectively, positioned in alignment on the same surface 14 of the crystal 12. In this embodiment, two P-N junction control electrodes 60 and 62 are provided adjacent the surface 16 of the crystal 12. In one circuit arrangement, the control electrodes 60 and 62 are jointly connected to a signal source 64 and to the negative terminal of a bias battery 66, the positive terminal of which is grounded. If desired, separate bias sources and separate signal sources may be connected to the two control electrodes 60 and 62. Electric field control action in the arrangement of Figure 2 is similar to that described with respect to Figure 1.

Referring to Figure 4, a third embodiment of the invention includes an N-type germanium crystal 68 having opposite surfaces 70 and 72 and an annular emitter electrode 74 in rectifying contact with the surface 70 and an annular collector electrode 76, of larger diameter than the emitter, in rectifying contact with the surface 72. The outer edge of the emitter ring is preferably vertically aligned with the inner edge of the collector ring to promote charge collection under the influence of an electric field. An ohmic base electrode 78 is soldered to the surface 70 within the emitter ring 74 and an ohmic ring electrode 80 is soldered to the periphery of the crystal 68. According to the invention, a comparatively large-area control P-N junction electrode 82 is positioned adjacent the surface 72 within the collector ring 76. The control electrode 82 preferably has a smaller diameter than the inside diameter of the emitter electrode 74 to prevent or minimize minority charge carrier collection by the control electrode.

The emitter ring 74 is connected to a signal source 84 and to a bias battery 86 and the collector ring 76 is connected to a load 88 and to a bias battery 90. A battery 92 is connected between the ohmic electrodes 78 and 80 and oriented to provide an electric field in the crystal for promoting emitter-to-collector current flow. In the manner of the foregoing embodiments of the invention, the control electrode 82 is connected to a signal source 94 and to a bias battery 96 to provide the desired control of the electric field provided in the crystal 68 by the battery 92.

The principles of the present invention may also be employed in a device of the type described and claimed in a co-pending U. S. patent application of J. I. Pankove, Serial No. 341,689, filed March 11, 1953 and assigned to the assignee of this application. Referring to Figure 5, this embodiment of the invention comprises an N-type germanium crystal 98 having opposite surfaces 100 and 102 and having a single emitter rectifying electrode 104 on one surface 100 thereof and two collector rectifying electrodes 106, 108 formed on the opposite surface 102. The collector electrodes are arranged generally symmetrically with respect to the emitter electrode and in longitudinal alignment therewith. Two base electrodes 110, 112 are mounted in ohmic contact at the ends of the semiconductor body and in longitudinal alignment with the emitter and collectors. According to the invention, a control P-N junction electrode 114 is provided on the surface 100 of the crystal and this electrode made be in the form of a ring as shown or may comprise two separate electrodes extending across the width of the crystal 98.

In the circuit of Figure 5. a first signal source 116 is connected between the two base electrodes 110 and 112 through a transformer 118 whereby a varying longitudinal electric field is established in the crystal 98. The emitter electrode 104 is connected to a signal source 120 and to the positive terminal of a battery 122 the negative terminal of which is connected to ground and to the midpoint of the transformer secondary winding. The collector electrodes 106, 108 are connected in a conventional fashion to suitable output circuits 124, 126, respectively.

According to the invention, the control electrode is connected to a signal source 128 and to a bias battery 130.

In operation of the device shown in Figure 5, the injected emitter current is fed to the collector electrodes 106 and 108 under the control of the electric field produced in the crystal 98 by the source 116. For example, if the signal applied between the base electrodes is a simple alternating signal, the device operates in a manner akin to push-pull operation and current flows first to one collector and then to the other. As in the foregoing embodiments of the invention, the signal applied to the control electrode 114 serves to further control the emitter-to-collector current by varying the electric field produced by the source 116.

The principles of the invention may also be applied to a type of semiconductor device such as that described and claimed in a co-pending U. S. patent application of G. C. Sziklai and G. B. Herzog, Serial No. 363,332, filed June 22, 1953 and assigned to the assignee of this application. Referring to Figure 6, said device comprises a crystal of N-type germanium 132 in the form of a circular disk or rectangular plate having an emitter rectifying electrode 133 positioned substantially at the center of one surface of the crystal and a plurality of, for example three, collector rectifying electrodes 134, 135, 136 spaced radially equidistant from the emitter electrode 133 and approximately 120° apart. A control P-N junction electrode 137 in the form of a ring as shown or as a plurality of individual electrodes is disposed around the collector electrodes.

Four ohmic base electrodes 138, 139, 140, 141 are spaced 90° apart about the periphery of the crystal 132 and are connected in pairs with a sinusoidal voltage source 142 connected between electrodes 138 and 140 and another sinusoidal voltage source 143 connected between electrodes 139 and 141. The voltages of the sources 142 and 143 are 90° out of phase to provide a rotating electric field in the crystal.

The emitter electrode 133 is connected to a signal source 144 and to a bias battery 145 and the collector electrodes 134, 135, 136 are connected, respectively to load circuits 146, 147, 148 and to a bias source 149. The control electrode 137 is connected to a signal source 150 and to a bias battery 151.

In operation of the device, the rotating field sweeps the emitter current, in turn, to each of the collector electrodes and, as described above, the control electrode serves to apply a controlling force to this electric field.

What is claimed is:

1. In a semiconductor device having a semiconductor body and input and output electrodes, the combination of means in contact with said body for providing an electric field oriented between said electrodes for controlling current flow within said body between said electrodes and a rectifying electrode for controlling said electric field and said current flow and positioned remote from said electrodes and out of collecting range of said current flow.

2. A semiconductor device comprising a body of semiconductor material, a plurality of rectifying electrodes in contact with said body, means in contact with said body for establishing an electric field therein oriented between said electrodes for controlling the flow of current between said electrodes, and a further rectifying electrode in contact with said body for controlling said electric field and positioned remote from said electrodes and out of collecting range of said current flow.

3. The device defined in claim 2 wherein said further rectifying electrode comprises a P-N junction electrode.

4. A semiconductor device comprising a body of semiconductor material, a first and a second rectifying electrode in contact with said body, means in contact with said body for establishing an electric field therein oriented between said electrodes for controlling the flow of current between said electrodes, and a third rectifying electrode in contact with said body for controlling said electric field and positioned remote from said electrodes and out of collecting range of said current flow.

5. A semiconductor device comprising a body of semiconductor material, a first and a second rectifying electrode in contact with different surfaces of said body, means in contact with said body for establishing an electric field therein oriented between said electrodes for controlling the flow of current between said electrodes, and a third rectifying electrode in contact with said body for controlling said electric field and positioned remote from said electrodes and out of collecting range of said current flow.

6. A semiconductor device comprising a body of semiconductor material, a first and a second rectifying electrode in contact with the same surface of said body, means in contact with said body for establishing an electric field therein oriented between said electrodes for controlling the flow of current between said electrodes, and a third rectifying electrode in contact with said body for controlling said electric field and positioned remote from said electrodes and out of collecting range of said current flow.

7. The device defined in claim 6 wherein said third electrode comprises a P-N junction electrode biased in the reverse direction with respect to said body and having a signal source connected thereto.

8. A semiconductor device comprising an elongated body of semiconductor material, a first and a second electrode in contact with said body, a pair of ohmic electrodes in contact with said body at opposite ends thereof aligned with said first and second electrodes and adapted for applying a longitudinal electric field in said body for controlling the current flow between said first and second electrodes, and a third rectifying electrode in contact with said body for controlling said electric field.

9. A semiconductor device comprising a body of semiconductor material, a first rectifying electrode mounted in contact with said body, a plurality of other rectifying electrodes in contact with said body and disposed about said first electrode, means in contact with said body for establishing a rotating electric field therein whereby the flow of current between said first electrode and said other electrodes is controlled and further means in contact with said body for controlling said electric field.

10. The device defined in claim 9 wherein said further means comprises a P-N junction electrode arrangement disposed about said plurality of other electrodes.

11. A semiconductor device comprising a body of semiconductor material, a first ring-shaped rectifying electrode in contact with one surface of said body, a second ring-shaped rectifying electrode in contact with another surface of said body and axially aligned with said first electrode, an ohmic electrode in contact with said one surface, a ring-shaped ohmic electrode in contact with said body and adapted to cooperate with said ohmic electrode to provide an electric field in said body, and means in contact with said body for varying said electric field.

12. A semiconductor device comprising a body of semiconductor material, a first rectifying electrode in contact with said body, a plurality of other rectifying electrodes in contact with said body, means connected to said body for establishing an electric field in said body and controlling the current flow between said first electrode and said plurality of electrodes, and further means in contact with said body for controlling said electric field.

13. A semiconductor device comprising a body of semiconductor material, a first rectifying electrode in contact with one surface of said body, a plurality of other rectifying electrodes in contact with another surface of said body, means connected to said body for establishing an electric field therein and controlling the current flow between said first electrode and said plurality of electrodes, and further means in contact with said body for controlling said electric field.

14. A semiconductor device comprising a body of semiconductor material, first and second electrodes in rectifying contact with said body, means for establishing a drift field oriented between said electrodes to promote current flow therebetween, and another electrode in rectifying contact with said body for controlling said drift field, said electrode being positioned remote from said first and second electrodes and out of the collecting range of said current flow.

References Cited in the file of this patent

UNITED STATES PATENTS

| | | |
|---|---|---|
| 2,561,411 | Pfann | July 24, 1951 |
| 2,662,976 | Pantchechnikoff | Dec. 15, 1953 |
| 2,666,814 | Shockley | Jan. 19, 1954 |